(12) United States Patent
Suzuki et al.

(10) Patent No.: US 6,707,681 B2
(45) Date of Patent: Mar. 16, 2004

(54) SURFACE MOUNT TYPED ELECTRONIC CIRCUIT OF SMALL SIZE CAPABLE OF OBTAINING A HIGH-Q

(75) Inventors: Takeo Suzuki, Fukushima-ken (JP); Shigeru Osada, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/346,324

(22) Filed: Jan. 17, 2003

(65) Prior Publication Data

US 2003/0137812 A1 Jul. 24, 2003

(30) Foreign Application Priority Data

Jan. 23, 2002 (JP) .......................................... 2002-014078

(51) Int. Cl.$^7$ ................................................. H05K 7/06
(52) U.S. Cl. ....................... 361/761; 361/763; 361/782; 361/783; 361/793; 257/700; 257/724
(58) Field of Search .................................. 361/782, 783, 361/793, 761, 763; 257/691, 723, 724, 778, 700; 174/260

(56) References Cited

U.S. PATENT DOCUMENTS 5,710,458 A * 1/1998 Iwasaki ....................... 257/679
6,310,386 B1 * 10/2001 Shenoy ....................... 257/531
2002/0118523 A1 * 8/2002 Okaba et al. ................ 361/793

FOREIGN PATENT DOCUMENTS

JP        2002-009225        1/2002

* cited by examiner

Primary Examiner—John B. Vigushin
(74) Attorney, Agent, or Firm—Brinks Hofer Gilson & Lione

(57) ABSTRACT

In the surface mount typed electronic circuit of the invention, an insulating substrate has an inductance element formed in a conductive pattern whose end portions are connected to the second lands. A bare chip is superimposed on the insulating substrate, so as to respectively connect the first electrodes and the second electrodes to the first lands and the second lands. Therefore, since the inductance element is positioned below the bare chip, the length of the connecting conductor between the inductance element and the semiconductor circuit can be extremely shortened, and a high-Q electronic circuit, especially in high-frequency, can be provided.

6 Claims, 4 Drawing Sheets

SURFACE MOUNT TYPED ELECTRONIC CIRCUIT OF SMALL SIZE CAPABLE OF OBTAINING A HIGH-Q

BACKGROUND OF THE INVENTION

1. Field of the Invention

The present invention relates to a preferred surface mount typed electronic circuit for use in a portable phone and the like.

2. Description of the Related Art

The conventional electronic circuit is formed in mounting electric components such as a resistor, a condenser, and a coil-shaped inductance element on an insulating substrate and mounting a bare chip forming a semiconductor circuit, on the insulating substrate at a position other than the position where the electric components are mounted.

In the conventional electronic circuit, the electric components must be mounted on a position distant from the bare chip surface, which prolongs an electric conductor connecting the electric components including the inductance element and the semiconductor circuit, hence to reduce Q especially in high-frequency.

Further, the electric components are bared on the insulating substrate, which enlarges the size problematically.

Then, the invention is to provide a surface mount typed electronic circuit of small size, which can obtain a high Q.

SUMMARY OF THE INVENTION

As first solving means of solving the above problem, the electronic circuit is provided with a plate-shaped bare chip where a semiconductor circuit is formed and a plate-shaped insulating substrate to be overlapped with this bare chip. On the bottom surface of the bare chip, a plurality of first electrodes connected to the semiconductor circuit and at least two second electrodes connected to the semiconductor circuit are provided. The insulating substrate includes a plurality of first lands provided on the top surface thereof corresponding to the first electrodes, at least two second lands provided on the top surface thereof corresponding to the second electrodes, a plurality of terminals for external connection having conductive pattern provided on the bottom surface, with at least one of them connected to the first lands, and an inductance element having the conductive pattern whose end portions are connected to the second lands. The bare chip is overlapped with the insulating substrate, so as to respectively connect the first electrodes and the second electrodes to the first lands and the second lands.

As second solving means, the surface mount typed electronic circuit is constituted in that the first electrodes are provided in an outer peripheral portion of the bare chip and the second electrodes are provided in a center of the bare chip, and that the first lands are provided in an outer peripheral portion of the insulating substrate and the second electrodes are provided in a center of the insulating substrate.

As third solving means, it is constituted in that the insulating substrate is formed by a stack of insulating thin plates.

As fourth solving means, it is constituted in that the inductance element is formed vortecosely.

As fifth solving means, it is constituted in that in the vortical inductance element, at least an intersecting portion thereof is formed on different surfaces in a thickness direction so as not to be in contact with each other.

As sixth solving means, it is constituted in that each of the respective terminals is formed in an area lager than each of the first lands.

As seventh solving means, it is constituted in that the terminals are distributed all over the bottom surface of the insulating substrate.

As eighth solving means, it is constituted in that a resistor and/or a condenser is formed within the insulating substrate depending on a thick film or a thin film.

DESCRIPTION OF THE PREFERRED EMBODIMENT

Figure 1:
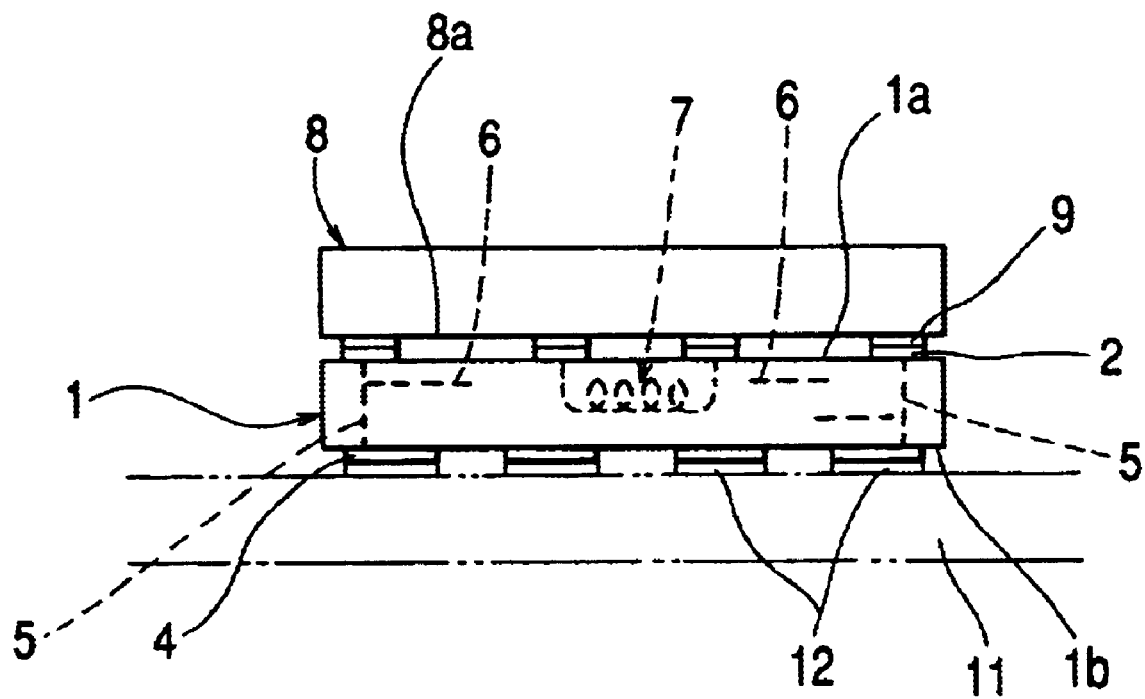
FIG. 1 is a front view showing the outline of a surface mount typed electronic circuit according to a first embodiment of the invention.
Figure 2:
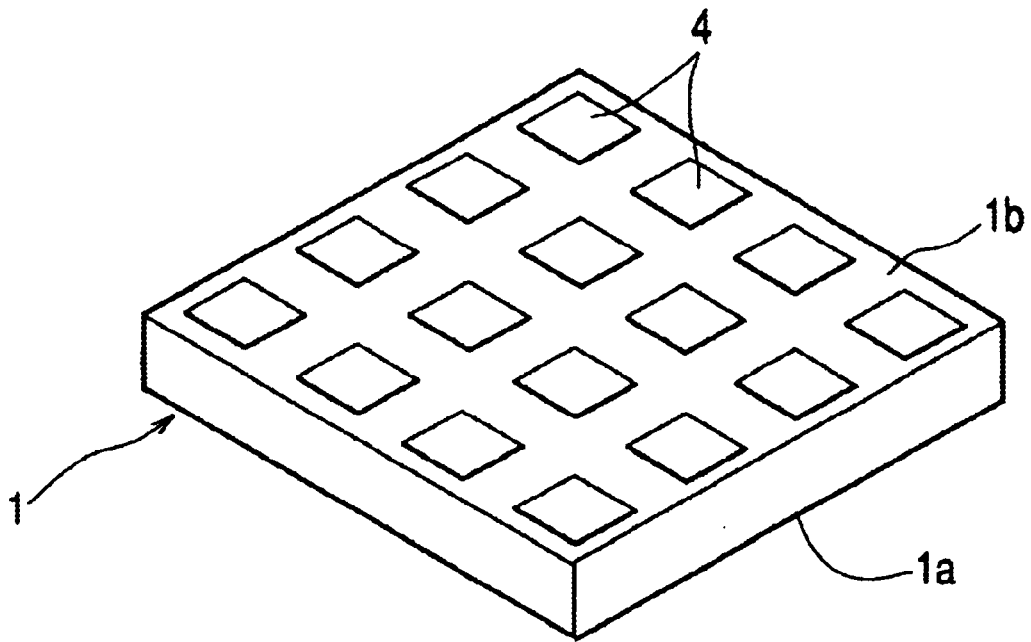
FIG. 2 is an exploded perspective view of the surface mount typed electronic circuit being turned over, according to the first embodiment of the invention.
Figure 2:
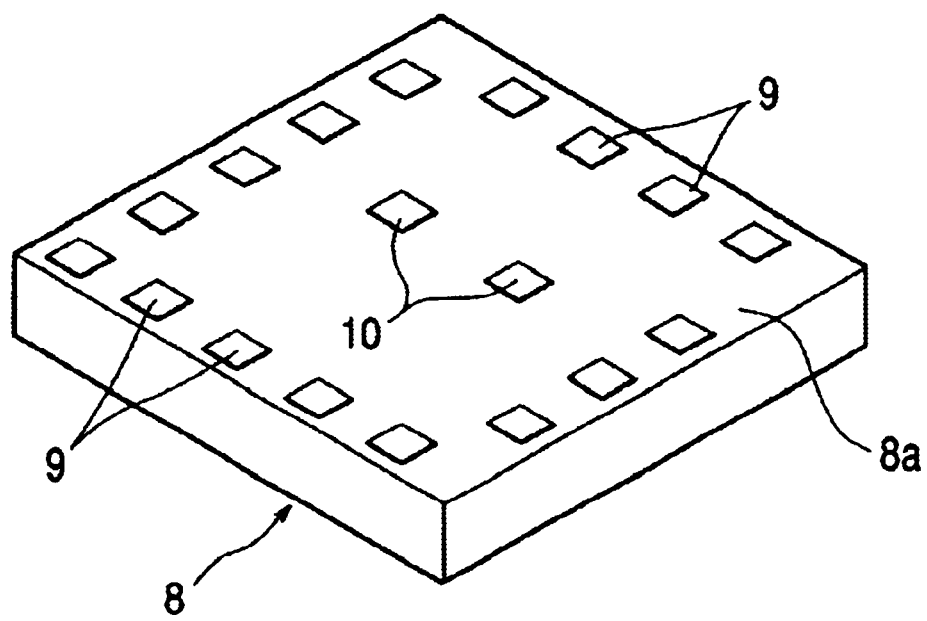
Figure 3:
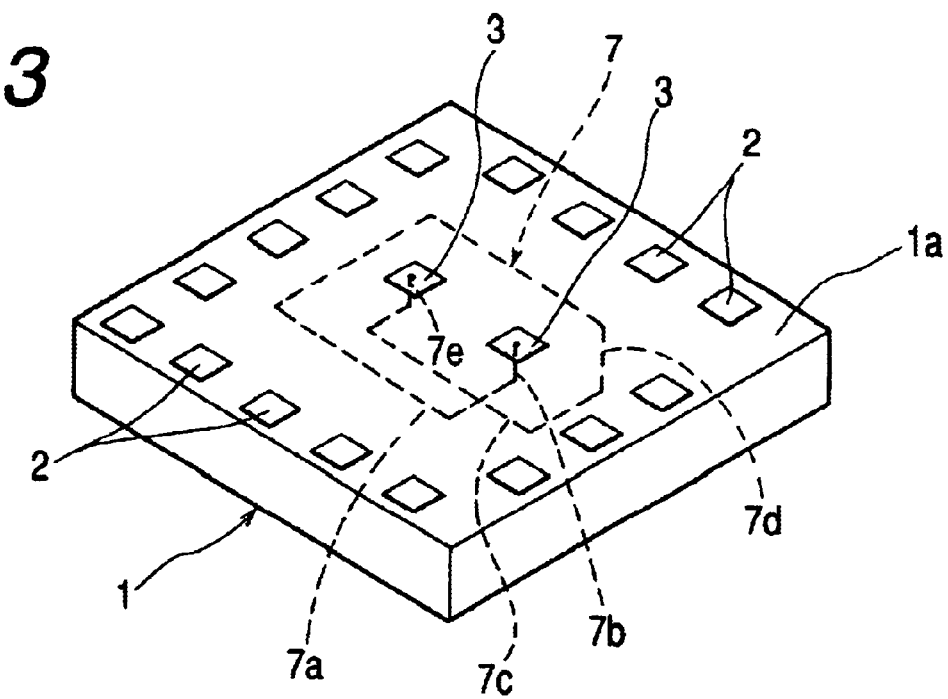
FIG. 3 is a perspective view of an insulating substrate of the surface mount typed electronic circuit, according to the first embodiment of the invention.

The drawings of a surface mount typed electronic circuit of the present invention will be described. FIG. 1 is a front view showing the outline of the surface mount typed electronic circuit according to the first embodiment of the invention; FIG. 2 is an exploded perspective view of the surface mount typed electronic circuit being turned over, according to the first embodiment of the invention; and FIG. 3 is a perspective view of an insulating substrate of the surface mount typed electronic circuit, according to the first embodiment of the invention.

Figure 4:
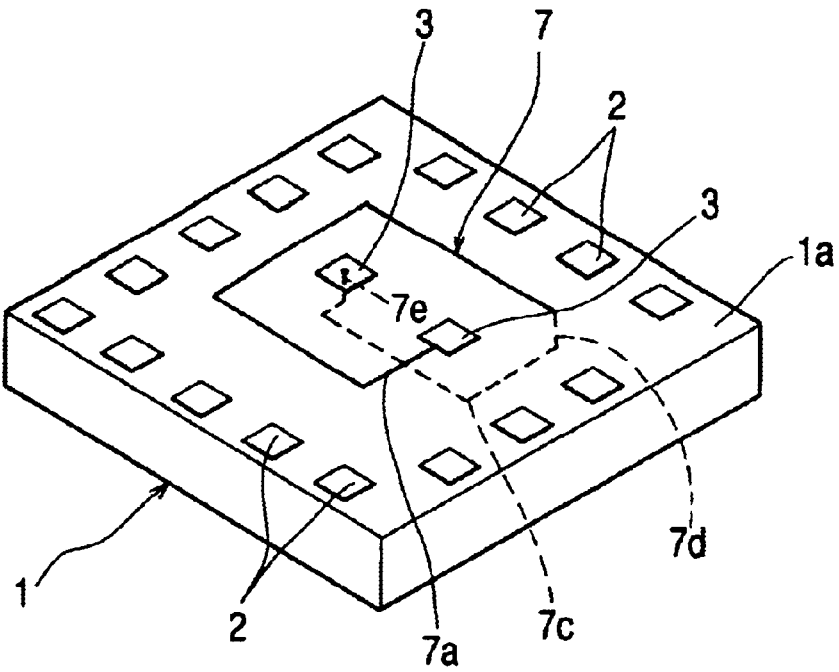
FIG. 4 is a perspective view of an insulating substrate of the surface mount typed electronic circuit, according to a second embodiment of the invention.
Figure 5:
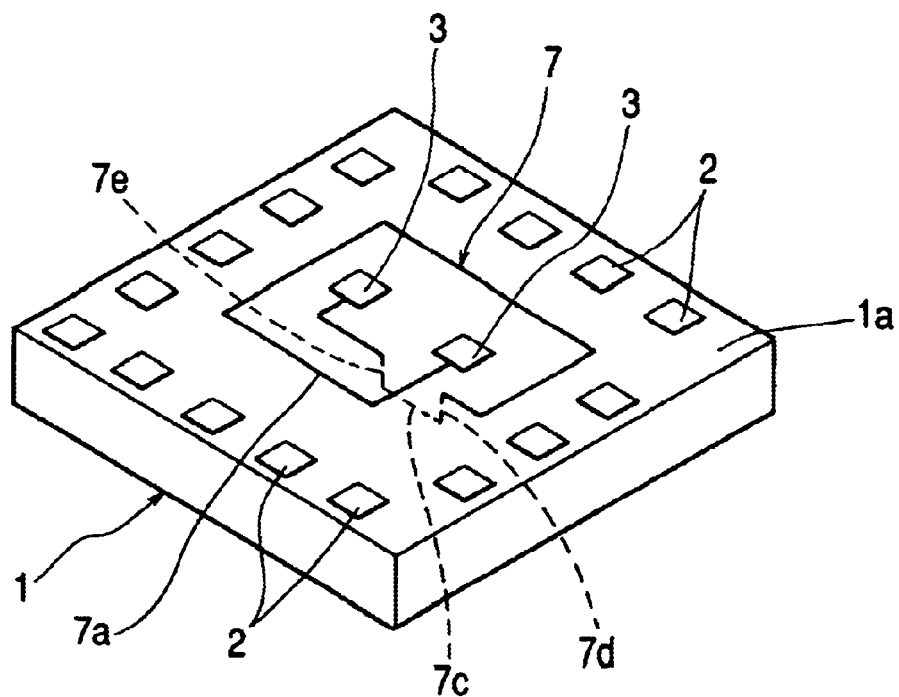
FIG. 5 is a perspective view of an insulating substrate of the surface mount typed electronic circuit, according to a third embodiment of the invention.
Figure 6:
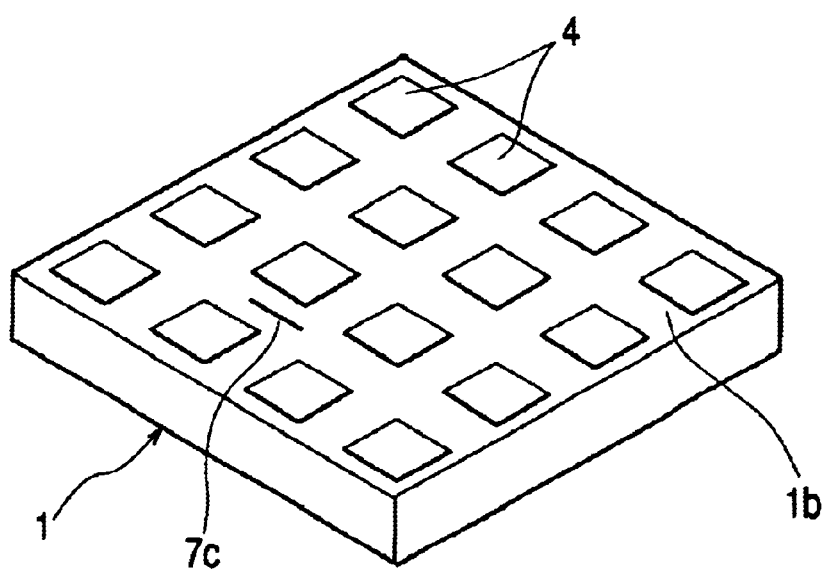
FIG. 6 is a perspective view of an insulating substrate of the surface mount typed electronic circuit being turned over, according to a fourth embodiment of the invention.

Further, FIG. 4 is a perspective view of an insulating substrate of the surface mount typed electronic circuit, according to the second embodiment of the invention; FIG. 5 is a perspective view of an insulating substrate of the surface mount typed electronic circuit, according to the third embodiment of the invention; and FIG. 6 is a perspective view of the surface mount type electronic circuit being turned over, according to the fourth embodiment of the invention.

Next, the structure of the surface mount typed electronic circuit according to the first embodiment of the invention will be described with reference to FIGS. 1 to 3. An insulating substrate 1 made of ceramic or the like in a shape of rectangular plate is formed by a stack of a plurality of insulating thin plates.

On the top surface 1a of the insulating substrate 1, a plurality of first lands 2 formed in each conductive pattern are provided in the outer peripheral portion of the insulating substrate 1 and two second lands 3 are provided in the center of the insulating substrate 1.

The first lands 2 and the second lands 3 are formed in each comparatively small area.

A plurality of terminals 4 formed in each conductive pattern for external connection are provided on the bottom surface 1b of the insulating substrate 1 in a state of being distributed on the whole bottom surface.

Each of the terminals 4 is formed in a larger area than each of the first lands 2 and the second lands 3, and at least one of the terminals 4 is connected with the first land 2 through a connecting conductor 5.

Further, a wiring pattern 6 is provided between the stacked layers of the insulating substrate 1. A resistor and a condenser, not illustrated here, are properly formed depending on a thick film or a thin film, and they are connected to the terminals 4 according to the wiring pattern 6 and the connecting conductor 5, thereby forming a desired electronic circuit.

An inductance element 7 formed in a conductive pattern is vorticosely formed in the center of the insulating substrate 1 and the both end portions thereof are respectively connected to the second lands 3, hence to be used, for example, as a tuning coil.

The whole inductance element 7 is provided within the insulating substrate 1, as illustrated in FIG. 3, and a first conductor 7a is formed between one stack of the stacked layers and this first conductor 7a is connected to one of the second lands 3 through a connector 7b.

A second conductor 7c is formed between the other stack different from the stack of forming the first conductor 7a, one end of the second conductor 7c is connected to the first conductor 7a through a connector 7d and the other end of the second conductor 7c is connected to the other of the second lands 3 through a connector 7e.

As a result, the first conductor 7a and the second conductor 7c intersect at a position, but they are formed between the different stacks, namely, on the different surfaces in a thickness direction in order not to be in contact with each other.

A bare chip 8 on which a semiconductor circuit (not illustrated) is formed is formed in a plate shape and on the bottom surface 8a of the bare chip 8, a plurality of first electrodes 9 are provided in the outer peripheral portion of the bare chip 8 and two second electrodes 10 are provided in the center of the bare chip 8.

The semiconductor circuit is connected to the first electrodes 9 and the second electrodes 10.

The first electrodes 9 and the second electrodes 10 are formed in each comparatively small area with the same size as each first land 2 and second land 3, and the first electrodes 9 and the second electrodes 10 are respectively formed in correspondence with the first lands 2 and the second lands 3.

The bare chip 8 having the above structure is superposed on the insulating substrate 1 with the first electrodes 9 and the second electrodes 10 in correspondence with the first lands 2 and the second lands 3, and the first electrodes 9 are soldered to the first lands 2 and the second electrodes 10 are soldered to the second lands 3.

As a result, the inductance element 7 formed on the insulating substrate 1 is connected to the two second electrodes 10 and the first lands 2 are connected to the first electrodes 9, hence to lead the semiconductor circuit to the terminals 4 provided on the bottom surface 1b of the insulating substrate 1. According to the structure, the surface mount typed electronic circuit is formed.

In the surface mount typed electronic circuit, the terminals 4 are positioned over a mother substrate 11, as illustrated in FIG. 1, and the terminals 4 are soldered to the wiring pattern 12 provided on the mother substrate 11, thereby mounting the electronic circuit on the surface.

FIG. 4 shows the second embodiment of the surface mount typed electronic circuit according to the invention. The structure of the second embodiment will be described. The first conductor 7a of the inductance element 7 is connected to one of the second lands 3, bared on the top surface 1a of the insulating substrate 1, the second conductor 7c is formed between the layers, and one end thereof is connected to the first conductor 7a through the connector 7d and the other end thereof is connected to the other of the second lands 3 through the connector 7e.

As a result, the first conductor 7a and the second conductor 7c intersect at a position, but they are formed between the different stacks, namely, on the different surfaces in a thickness direction in order not to be in contact with each other.

The other structure is the same as that of the first embodiment, and therefore the same reference numerals are attached to the same components, hence to omit the description thereof here.

FIG. 5 shows the third embodiment of the surface mount typed electronic circuit according to the invention. The structure of the third embodiment will be described. The first conductor 7a of the inductance element 7 is connected to the both second lands 3, bared on the top surface 1a of the insulating substrate 1.

One portion of the first conductor 7a is cut, the second conductor 7c joining the cut portion is formed between the layers in an intersecting way with the first conductor 7a, and the both end portions of the second conductor 7c are respectively connected to the first conductor 7a through the connectors 7d and 7e. As a result, the first conductor 7a and the second conductor 7c intersect at a position, but they are formed between the different stacks, namely, on the different surfaces in a thickness direction in order not to be in contact with each other.

The other structure is the same as that of the second embodiment, and the same reference numerals are attached to the same components, hence to omit the description thereof here.

FIG. 6 shows the fourth embodiment of the surface mount typed electronic circuit according to the invention. The structure of the fourth embodiment will be described. The second conductor 7c of the inductance element 7 is formed on the bottom surface 1b of the insulating substrate 1.

The other structure is the same as that of the third embodiment and the same reference numerals are attached to the same components, hence to omit the description thereof here.

The insulating substrate may be formed by a single plate not the stacked layers, and the inductance element may be formed in any other shape than the vortical shape.

Further, it is needless to say that the vortical inductance element may be variously modified besides the above embodiments.

The surface mount typed electronic circuit of the invention comprises a plate-shaped bare chip where a semiconductor circuit is formed and a plate-shaped insulating substrate to be overlapped with the bare chip, the bare chip including a plurality of first electrodes connected to the semiconductor circuit and at least two second electrodes connected to the semiconductor circuit on the bottom surface thereof, the insulating substrate including a plurality of first lands provided on the top surface thereof corresponding to the first electrodes, at least two second lands provided on the top surface thereof corresponding to the second electrodes, a plurality of terminals for external connection having conductive pattern provided on the bottom surface, with at least one of the terminals connected to the first land, and an inductance element having a conductive pattern whose end portions are connected to the second lands, wherein the bare chip is overlapped with the insulating substrate so as to respectively connect the first electrodes and the second electrodes to the first lands and the second lands. Therefore, since the inductance element is positioned below the bare chip, the length of the connecting conductor between the inductance element and the semiconductor circuit can be much shortened, and a high-Q electronic circuit, especially in high-frequency, can be provided.

Further, since the inductance element formed in a conductive pattern is positioned at the opposite side of the bare chip, it is improved in the space factor more than the conventional one and a thinner and smaller circuit can be obtained.

Since the first electrodes are provided in an outer peripheral portion of the bare chip and the second electrodes are provided in a center of the bare chip, and the first lands are provided in an outer peripheral portion of the insulating substrate and the second electrodes are provided in a center of the insulating substrate, a lot of the first electrodes and the first lands can be disposed compactly and the second electrodes and the second lands can be disposed in an empty space of the center, thereby providing a small electronic circuit on the whole.

Since the insulating substrate is formed by a stack of insulating thin plates, the electric components such as the inductance element can be disposed between the stacked layers, thereby providing a thin and small circuit.

Since the inductance element is formed vorticosely, a small inductance element can be obtained.

Since at least an intersecting portion of the vortical inductance is formed on different surfaces in a thickness direction so as not to be in contact with each other, insulation between the conductors is easy and assured, thereby obtaining a thin and small inductance element.

Since each of the respective terminals is formed in an area lager than each of the first lands, soldering to the mother substrate can be assured.

Since the terminals are distributed all over the bottom surface of the insulating substrate, a lot of the terminals each having a large area can be disposed.

Since a resistor and/or a condenser is formed within the insulating substrate depending on a thick film or a thin film, a thinner and smaller electronic circuit than the conventional one can be provided.

What is claimed is:

1. A surface mount type electronic circuit, comprising:
   a plate-shaped bare chip where a semiconductor circuit is formed; and
   a plate-shaped insulating substrate to be overlapped with the bare chip,
   the bare chip including a plurality of first electrodes connected to the semiconductor circuit and at least two second electrodes connected to the semiconductor circuit on a bottom surface thereof, the insulating substrate including a plurality of first lands provided on a top surface thereof corresponding to the first electrodes, at least two second lands provided on the top surface thereof corresponding to the second electrodes, a plurality of terminals for external connection having conductive pattern provided on a bottom surface, with at least one of the terminals connected to the first land, and an inductance element having a conductive pattern whose end portions are connected to the second lands,
   wherein the bare chip is overlapped with the insulating substrate so as to respectively connect the first electrodes and the second electrodes to the first lands and the second lands, the inductance element is formed vorticosely, and in the vortical inductance element, portions of the vortical inductance element intersect and are formed on different surfaces in a thickness direction so as not to be in contact with each other.

2. The surface mount type electronic circuit, according to claim 1, wherein the first electrodes are provided in an outer peripheral portion of the bare chip and the second electrodes are provided in a center of the bare chip, and the first lands are provided in an outer peripheral portion of the insulating substrate and the second lands are provided in a center of the insulating substrate.

3. The surface mount type electronic circuit, according to claim 1, wherein the insulating substrate is formed by a stack of insulating thin plates.

4. The surface mount type electronic circuit, according to claim 1, wherein each of the respective terminals is formed in an area larger than each of the first lands.

5. The surface mount type electronic circuit, according to claim 4, wherein the terminals are distributed all over the bottom surface of the insulating substrate.

6. The surface mount type electronic circuit, according to claim 1, wherein one of a resistor and a condenser is formed within the insulating substrate depending on a thickness of the insulating substrate.

* * * * *